United States Patent
Broekmaat et al.

(10) Patent No.: US 8,979,282 B2
(45) Date of Patent: Mar. 17, 2015

(54) DEVICE FOR PROJECTING AN IMAGE ON A SURFACE AND DEVICE FOR MOVING SAID IMAGE

(75) Inventors: Joska Johannes Broekmaat, Enschede (NL); Jan Matthijn Dekkers, Aadorp (NL); Jan Arnaud Janssens, Deventer (NL)

(73) Assignee: Solmates B.V., Enschede (NL)

( * ) Notice: Subject to any disclaimer, the term of this patent is extended or adjusted under 35 U.S.C. 154(b) by 440 days.

(21) Appl. No.: 13/142,546

(22) PCT Filed: Dec. 22, 2009

(86) PCT No.: PCT/EP2009/067760
§ 371 (c)(1),
(2), (4) Date: Jul. 21, 2011

(87) PCT Pub. No.: WO2010/079092
PCT Pub. Date: Jul. 15, 2010

(65) Prior Publication Data
US 2011/0292354 A1  Dec. 1, 2011

(30) Foreign Application Priority Data
Jan. 6, 2009  (EP) .................................... 09150125

(51) Int. Cl.
G03B 21/14 (2006.01)
C23C 14/28 (2006.01)
B23K 26/06 (2014.01)
B23K 26/073 (2006.01)

(52) U.S. Cl.
CPC ............. *C23C 14/28* (2013.01); *B23K 26/0656* (2013.01); *B23K 26/073* (2013.01)
USPC ........................................................ 353/119

(58) Field of Classification Search
CPC ........................................................ G03B 27/42
USPC ............. 353/97; 219/121.74, 121.6; 372/109; 355/52, 53
See application file for complete search history.

(56) References Cited

U.S. PATENT DOCUMENTS

| | | | | |
|---|---|---|---|---|
| 5,010,537 A | * | 4/1991 | Ohkuma et al. | 369/44.32 |
| 5,466,908 A | | 11/1995 | Hosoya et al. | |
| 5,567,935 A | * | 10/1996 | Fajardo et al. | 250/251 |
| 5,685,998 A | | 11/1997 | Shannon et al. | |
| 5,736,464 A | | 4/1998 | Opower | |
| 5,910,260 A | * | 6/1999 | Gerber | 219/121.67 |
| 6,110,291 A | * | 8/2000 | Haruta et al. | 118/726 |
| 2004/0252730 A1 | * | 12/2004 | McCaughan et al. | 372/6 |
| 2006/0163223 A1 | * | 7/2006 | Zhang et al. | 219/121.73 |

FOREIGN PATENT DOCUMENTS

| | | | |
|---|---|---|---|
| JP | 6224219 A | | 2/1987 |
| JP | 62024219 A | * | 2/1987 |

* cited by examiner

*Primary Examiner* — Sultan Chowdhury
*Assistant Examiner* — Danell L Owens
(74) *Attorney, Agent, or Firm* — The Webb Law Firm

(57) ABSTRACT

The invention relates to a device for projecting an image on a surface, comprising: a light source generating a light beam; a mask arranged in the path of the light beam; a lens arranged behind the mask to focus the image of the mask on a surface, wherein the surface is not parallel to the lens, wherein at substantially each position along the edges of the mask the distance v to the lens and the distance b of the corresponding position at the edges of the image of the mask to the lens correspond substantially to the formula $1/v + 1/b = 1/f$, wherein f is the focal length of the lengths. The invention also relates to a device for moving the image on the surface.

5 Claims, 3 Drawing Sheets

DEVICE FOR PROJECTING AN IMAGE ON A SURFACE AND DEVICE FOR MOVING SAID IMAGE

BACKGROUND OF THE INVENTION

1) Field of the Invention

The invention relates to a device for projecting an image on a surface, comprising:
- a light source generating a light beam;
- a mask arranged in the path of the light beam;
- a lens arranged behind the mask to focus the image of the mask on a surface, wherein the surface is not parallel to the lens.

2) Description of the Prior Art

In particular in the field of pulsed laser deposition (PLD) it is important to control the projection of an image on a surface. With PLD a laser light beam is projected under an angle onto a surface of an ablatable material. The projected image is a spot in which the energy of the laser light beam is concentrated. This energy causes the material of the surface to evaporate into a plasma plume, which plume can be used to coat the surface of a substrate.

With PLD it is important that the spot, which is the image of the mask, is homogeneous, such that the laser energy is distributed evenly. This is necessary to have a plasma plume which corresponds in composition to the solid material of the surface on which the spot is projected. If the spot is not homogeneous it is possible that some components of the material of the surface go into the plasma phase, some components only melt and form drops and some components stay solid.

As with PLD the light beam is generally projected under an angle onto the surface, the spot will always be somewhat inhomogeneous. This inhomogeneity will be more prominent as the angle between the light beam and the surface decreases. With the wording "under an angle" it is understood that the light beam is not perpendicular and not parallel to the surface.

The tendency in the field of PLD is to coat increasingly larger surfaces of substrates. As the substrate must be positioned near the surface on which the light beam is projected, the space through which the light beam can be directed onto the surface decreases and the angle between the light beam and the surface decreases correspondingly, resulting in a more and more inhomogeneous energy distribution.

SUMMARY OF THE INVENTION

It is now an object of the invention to diminish or even prevent the above mentioned disadvantages.

This object is achieved by a device according to the invention, wherein at substantially each position along the edges of the mask the distance v to the lens and the distance b of the corresponding position at the edges of the image of the mask to the lens correspond substantially to the formula $1/v+1/b=1/f$, wherein f is the focal length of the lens.

By having the mask aligned such to the lens that each point along the edge of the mask complies with the above mentioned formula, a sharp image is projected on the surface. When the invention is used in PLD, a sharp spot is projected and accordingly a homogeneous energy distribution in the spot is achieved.

In a preferred embodiment of the device according to the invention, the surface is flat and arranged under an angle with the lens and wherein the mask is a flat plate having an opening through which the light beam runs and wherein the flat plate is arranged under an angle with the lens.

This embodiment provides a simple solution for the invention. As the surface is flat and the mask is a flat plate, it is sufficient to ensure that some points along the edge of the mask comply to the formula to have a sharp image projected on the surface.

In another embodiment of the device according to the invention the surface is curved and the mask is curved to comply with the formula $1/v+1/b=1/f$.

With the invention it is also possible to project sharp spots on curved surfaces. This does however require that the mask is also shaped, again such that each point along the edge of the mask and the corresponding point of the images complies to the formula $1/v+1/b=1/f$.

In yet another embodiment of the device according to the invention the mask is composed out of a plurality of mask portions. The mask portions are small masks, which in combination provide a large mask suitable for a device according to the invention. With the small masks it can be easier to provide a curved mask necessary for a certain curved projection surface. Preferably each mask portion is a flat element with an opening. Such mask portions can be easily manufactured.

Although the small mask portions provide a main mask having discrete steps, the deviations are small such that still a considerable advantage is achieved in comparison to the prior art.

With the small mask portions, it would even be possible to adapt the mask depending on the shape of the projection surface, by having the mask portions adjustable either manually or controlled. In this latter possibility it would be possible to adjust the mask while projecting the image and moving the surface relative to the light beam or while changing the angle of the light beam.

In another preferred embodiment of the device according to the invention the surface is the surface of an ablatable material and wherein the light beam is a laser beam to generate a plasma plume of the ablatable material.

These characteristics are typical for a device for pulsed laser deposition. Preferably, a substrate is arranged parallel to the surface of the ablatable material, such that the surface of the substrate is coated with the ablatable material.

With pulsed laser deposition is also common to move the projected spot along the surface of the ablatable material. By moving the spot, the generated plasma plume is also moved cause a spread of the plasma plume over the surface of the substrate. This movement of the spot is generally achieved by reflecting the light beam by a tiltable mirror. When tilting the mirror the spot can be moved along the surface of the ablatable material.

However, moving the spot with a tiltable mirror also causes the distance b between a position at the edges of the image of the mask and the lens to change. This results in an unsharp image of the mask on the surface. This could be corrected by changing the position and orientation of the mask.

However according to the invention the movement of the spot without influencing the focus can be achieved at a different way, which can also be used independently of the above mentioned invention relating to focusing the spot. So, the movement of the spot according to the invention can also be used with the prior art devices.

The movement of the spot, without influencing the focus of the spot is achieved by a device for directing a light beam under an angle onto a surface and moving said tilted light beam along the surface, the device comprising:
- a carriage movable in a first direction parallel to the surface and parallel to the entry path of the light beam;

a first mirror arranged on the carriage for directing the light beam under an angle; and a lens arranged on the carriage and behind the first mirror for focusing the light beam on the surface.

In the field of PLD, the distance v of the mask to the lens is a considerably larger than the distance b of the image to the lens. So, as long as the distance b between the image of the mask and the lens is kept constant, small changes in the distance v do not influence the focus of the image noticeably. Now according to the invention, the distance b is kept constant by moving the mirror and lens together and in the same direction as the entry path of the light beam.

In a preferred embodiment, the device according to the invention comprises a second mirror arranged between the first mirror and the lens for further directing the light beam.

When the distance b and distance v are of the same order it is preferred to have the mask move together with the carriage, such that the distance b and distance v are kept constant when moving the carriage and accordingly moving the spot along the surface, keeping the spot focused at all times.

Yet another preferred embodiment of the invention comprises:
- a second carriage, on which the first carriage is movable in a first direction, said second carriage being movable in a second direction perpendicular to the first direction and parallel to the surface;
- a stationary mirror for deflecting the arriving light beam in the second direction; and
- a third mirror arranged on the second carriage for deflecting the light beam from the stationary mirror in the first direction.

With this embodiment it is possible to move the spot along two axises over the surface. This has the advantage, that the shape of the surface is no longer limited to a circular shape as common in the prior art. Another advantage is that the pulse frequency of the laser is no longer dependent on the position of the spot on the surface. In the prior art, the circular surface is rotated and when the spot is near the center of the surface, the frequency of the laser must be kept low to have a even coating over the full surface of a parallel substrate. Now with the invention it is possible to move the spot at any desired speed along the surface, making it possible to use the maximum pulse frequency of the laser, resulting in a high depositing speed.

Yet another advantage is that depositing can be performed locally, as the spot can be moved to specific coordinates on the surface. By using a shadow mask, the locally deposited coating can be precisely defined on the substrate.

It is furthermore possible to also move the target along with the movement of the spot. This would require a smaller target, while still be able to deposit a coating on relative large substrate surfaces.

The invention furthermore provide a combination of a device according to the invention for projecting an image on a surface and a device according to the invention for directing a light beam under an angle onto a surface and moving said tilted light beam along the surface.

With the invention it is preferred that the axis of the lens substantially coincides with the axis of the light beam, although it would be possible to have an angle between the axis of the lens and the light beam.

BRIEF DESCRIPTION OF THE DRAWINGS

These and other advantages of the invention will be elucidated in conjunction with the accompanying drawings.

DETAILED DESCRIPTION OF THE PREFERRED EMBODIMENTS

Figure 1:
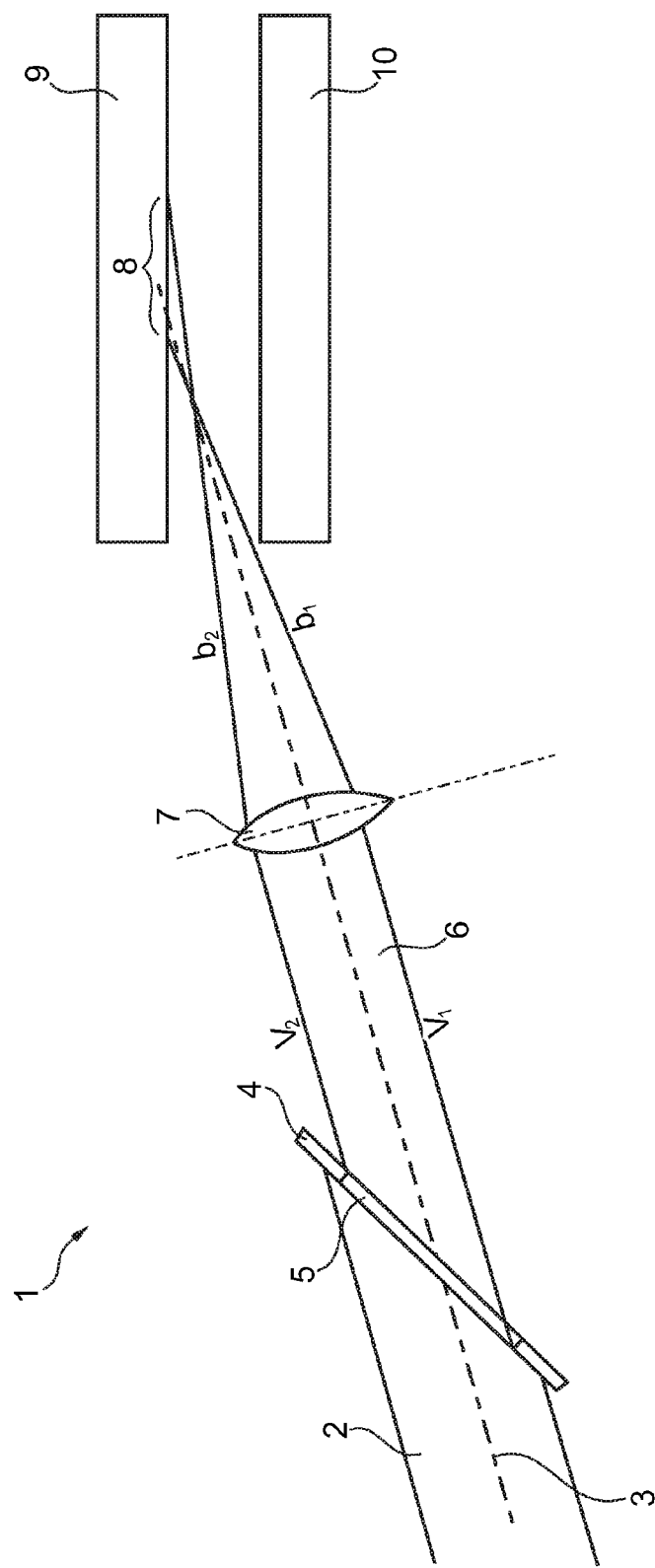
FIG. 1 shows a schematic view of a device for projecting an image on a surface.

In FIG. 1 a schematic view of an embodiment of a device according to the invention is shown. In particular, the device 1 is suitable for pulsed laser deposition (PLD).

The device 1 generates a laser beam 2, which has an axis 3. This laser beam 2 is projected on to a mask 4, which is in this embodiment a plate with an opening 5.

The laser beam part 6, which goes through the opening 5 of the mask 4 falls on the lens 7, which focuses the beam and projects a spot 8 on a surface 9. The energy applied on the surface 9 by the spot 8 can generate a plume (not shown) of evaporated material of the surface 9. This plume will then be deposited on a substrate 10.

In order to have a focused spot 8 on the surface 9, it is necessary that the distance $v_1$, $v_2$ from substantially each position along the edges of the mask opening 5 to the lens 7 and the distance $b_1$, $b_2$ of the corresponding position at the edges of the spot 8, i.e. the image of the mask 4, to the lens 7 correspond to the formula $1/v_1+1/b_1=1/f$ and $1/v_2+1/b_2=1/f$ respectively, wherein f is the focal length of the lens 7.

Figure 2:
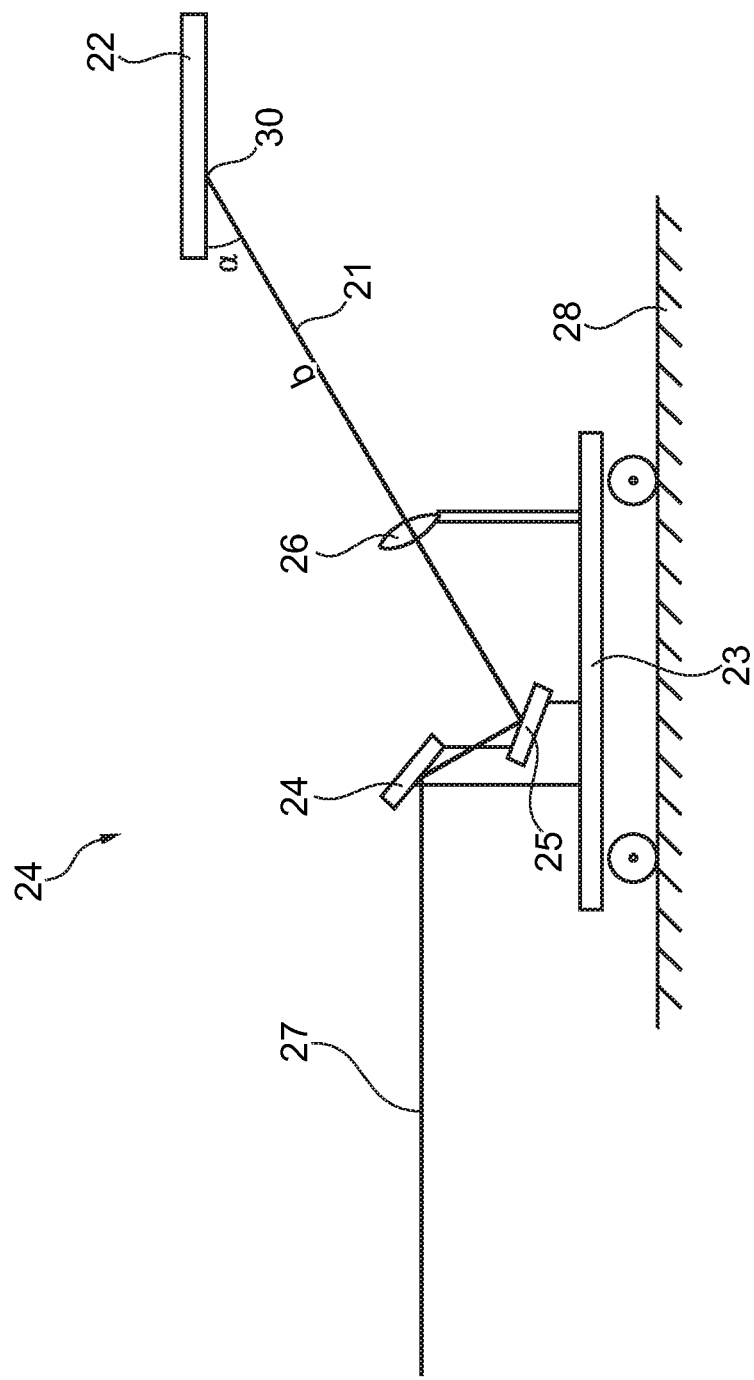
FIG. 2 shows a schematic view of a device for directing a light beam under an angle onto a surface and moving said tilted light beam along the surface.

In FIG. 2 a device 20 is shown for directing a light beam 21 under an angle • onto a surface 22 and moving said tilted light beam 21 along the surface 22.

The device has a carriage 23, which can be moved over a surface 28. On this carriage 23 a first mirror 24, a second mirror 25 and a lens 26 is arranged.

The entry path 27 of the light beam 21 is parallel to the surface 28, such that the light beam 21 falls onto the mirror 24 at a constant angle independent of the position of the carriage 23 along the surface 28.

The light beam 21 is then reflected by mirror 24 onto a second mirror 25, which reflects the light beam towards the lens 26. This lens then focuses the light beam 21, such that a focused spot 30 is projected on the surface 22.

Now when the carriage 23 is moved along the surface 28, the projected spot 30 will move accordingly over the surface 22. As the surface 22 is parallel to the surface 28, the distance b between the lens 26 and the spot 30 does not change when the carriage 23 and thus the spot 30 is moved.

So with a device 20 according to the invention it is possible to move a spot 30 along a surface 22 while maintaining the focus of the spot 30.

Figure 3:
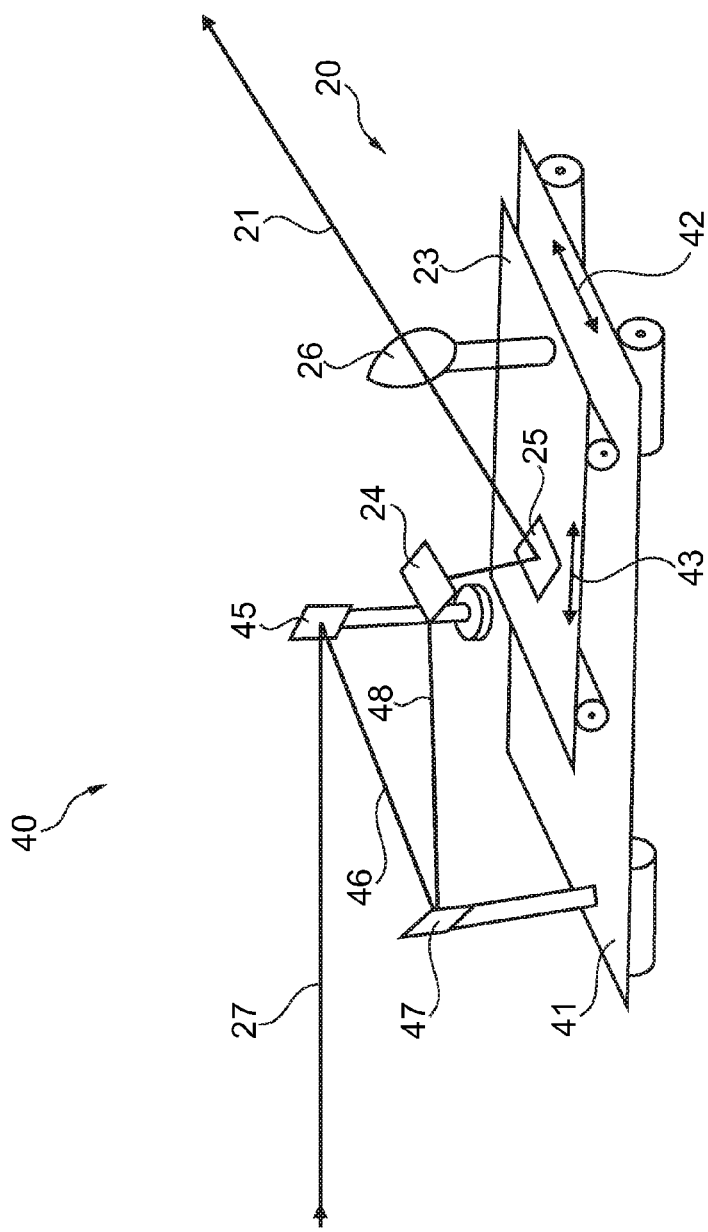
FIG. 3 shows a schematic view of a second embodiment of a device for directing a light beam.

In FIG. 3 a schematic view of a second embodiment of a device for directing a light beam is shown.

This device 40 has a second carriage 41, which is movable in a second direction 42. On this second carriage 41 the first carriage 23 (as also shown in FIG. 2) is placed. This first carriage 23 is movable in a first direction 43. The first direction 43 and second direction 42 are perpendicular.

On the second carriage 41 a third mirror 44 is arranged and adjacent to the second carriage 41 a stationary mirror 45 is placed.

The light beam 27 enters the device 40 via the stationary mirror 45. The entry path 27 is parallel to the first direction 43. The stationary mirror 45 reflects the light beam such that the reflected beam 46 is parallel to the second direction 42. The reflected beam 46 then hits the third mirror 47, which reflects the beam in the direction parallel to the first direction 43. This reflected beam 48 then enters the device 20 as described in conjunction with FIG. 2.

With this device 40 it is possible to direct the light beam 21 at any location on a surface, while maintaining the focus of the spot on that surface.

The invention claimed is:

1. A device for projecting an image on a surface, comprising:
   - a light source generating a light beam;
   - a mask arranged in the path of the light beam; and
   - a lens arranged behind the mask to focus the image of the mask on a surface, wherein the surface is not parallel to the lens
   - wherein at substantially each position along the edges of the mask the distance v to the lens and the distance b of the corresponding position at the edges of the image of the mask to the lens correspond substantially to the formula $1/v+1/b=1/f$, wherein f is the focal length of the lens, wherein the surface is the surface of an ablatable material and the light beam is a laser beam to generate a plasma plume of the ablatable material, wherein a substrate is arranged such that the surface of the substrate is coated with the ablatable material, and wherein the mask is a flat plate and the flat plate is arranged under an angle with the lens.

2. The device according to claim 1, wherein the substrate is arranged parallel to the surface of the ablatable material.

3. The device according to claim 1, wherein a device for directing a light beam under an angle onto a surface and moving a tilted light beam along the surface, the device comprising:
   - a first carriage movable in a first direction parallel to the surface and parallel to the entry path of the light beam;
   - a first mirror arranged on the first carriage for directing the light beam under an angle to a lens arranged on the first carriage and behind the first mirror for focusing the light beam on the surface and
   - a second mirror arranged between the first mirror and the lens for further directing the light beam.

4. The device according to claim 3, further comprising:
   - a second carriage, on which the first carriage is movable in a first direction, said second carriage being movable in a second direction perpendicular to the first direction and parallel to the surface;
   - a stationary mirror for deflecting the arriving light beam in the second direction; and
   - a third mirror arranged on the second carriage for deflecting the light beam from the stationary mirror in the first direction.

5. A system for directing a light beam under an angle onto a surface and moving the light beam along the surface, the system comprising:
   - a device for projecting the light beam on the surface, comprising:
     - a light source generating the light beam;
     - a mask arranged in the path of the light beam; and
     - a lens arranged behind the mask to focus the image of the mask on the surface,
   - wherein the surface is not parallel to the lens, and
     - at substantially each position along the edges of the mask the distance v to the lens and the distance b of the corresponding position at the edges of the image of the mask to the lens correspond substantially to the formula $1/v+1/b=1/f$, wherein f is the focal length of the lens, and
   - the surface is the surface of an ablatable material and the light beam is a laser beam to generate a plasma plume of the ablatable material, and
   - a substrate is arranged such that the surface of the substrate is coated with the ablatable material, and
   - a device for moving the light beam along the surface comprising:
     - a first carriage movable in a first direction parallel to the surface and parallel to the entry path of the light beam;
     - a first mirror arranged on the first carriage for directing the light beam under an angle; and
     - a lens arranged on the first carriage and behind the first mirror for focusing the light beam on the surface.

* * * * *